United States Patent [19]

Nathanson et al.

[11] Patent Number: 5,449,953
[45] Date of Patent: Sep. 12, 1995

[54] MONOLITHIC MICROWAVE INTERGRATED CIRCUIT ON HIGH RESISTIVITY SILICON

[75] Inventors: Harvey C. Nathanson, Pittsburgh, Pa.; Michael W. Cresswell, Frederick, Md.; Thomas J. Smith, Jr., Salem Township, Pa.; Lewis R. Lowry, Jr., Scott Township, Ohio; Maurice H. Hanes, Murrysville, Pa.

[73] Assignee: Westinghouse Electric Corporation, Pittsburgh, Pa.

[21] Appl. No.: 358,041

[22] Filed: Dec. 15, 1994

Related U.S. Application Data

[63] Continuation of Ser. No. 123,770, Sep. 20, 1993, abandoned, which is a continuation-in-part of Ser. No. 583,059, Sep. 14, 1990, abandoned.

[51] Int. Cl.$^6$ ............ H01L 23/36; H01L 23/29; H01L 23/48; H01P 3/08
[52] U.S. Cl. .................. 257/728; 257/604; 257/624; 257/625; 257/659; 257/664; 333/246; 333/247
[58] Field of Search .......... 357/71, 22, 23.7, 29, 357/81, 22, 80, 74; 257/659, 664, 169, 170, 276, 259, 275, 452, 482, 604, 624, 625, 728; 333/246, 247

[56] References Cited

U.S. PATENT DOCUMENTS

| | | | |
|---|---|---|---|
| 3,416,042 | 12/1968 | Thomas et al. | 257/664 |
| 3,489,953 | 1/1970 | Thomas | 257/659 |
| 3,508,125 | 4/1970 | Ertel et al. | 257/664 |
| 3,514,676 | 5/1970 | Fa | 357/23.7 |
| 4,054,895 | 10/1977 | Ham . | |
| 4,091,408 | 5/1978 | Lee et al. | 357/81 |
| 4,724,220 | 2/1988 | Calviello . | |
| 4,753,895 | 6/1988 | Mayer et al. . | |
| 4,758,872 | 7/1988 | Hadac . | |
| 4,766,482 | 8/1988 | Smeltzer et al. . | |
| 4,816,893 | 3/1989 | Mayer et al. . | |
| 4,823,136 | 4/1989 | Nathanson et al. . | |
| 4,864,377 | 9/1989 | Widdershoven | 357/23.7 |
| 4,914,491 | 4/1990 | Vu | 357/23.7 |
| 5,021,300 | 6/1991 | Stacey | 357/71 |
| 5,049,978 | 9/1991 | Bates et al. | 357/81 |
| 5,060,035 | 10/1991 | Nishimura et al. | 357/23.7 |
| 5,066,993 | 11/1991 | Miura et al. | 357/23.7 |

OTHER PUBLICATIONS

Guerra, M. A., "The Status of Simox Technology", Solid State Technology Nov. 1990.

Kamgar A. et al., "Ultra-Fast (0.5 μM) CMOS Circuits in Fully Depleted SOI Films", IEEE Transaction of Electron Devices, vol. 39, No. 3, Mar. 1992.

*Primary Examiner*—Sara W. Crane
*Assistant Examiner*—Carl Whitehead, Jr.

[57] ABSTRACT

A silicon-based monolithic microwave integrated circuit architecture is described. This architecture, called MICROX TM, is a combination of silicon material growth and wafer processing technologies. A wafer is fabricated using a substrate of high resistivity silicon material. An insulating layer is formed in the wafer below the surface area of active silicon, preferably using the SIMOX process. A monolithic circuit is fabricated on the wafer. A ground plane electrode is formed on the back of the wafer. Direct current and rf capacitive losses under microstrip interconnections and transistor source and drain electrodes are thereby minimized. Reduction in the resistivity of the substrate material as a result of CMOS processing can be minimized by maintaining a shielding layer over the bottom surface of the wafer. Microstrip and airbridge connectors, salicide processing and nitride side wall spacing can be used to further enhance device performance. The resulting architecture is an alternative to gallium arsenide integrated circuits for microwave applications.

10 Claims, 6 Drawing Sheets

MONOLITHIC MICROWAVE INTERGRATED CIRCUIT ON HIGH RESISTIVITY SILICON

This application is a continuation of application Ser. No. 08/123,770 filed Sep. 20, 1993, now abandoned, which is a continuation-in-part of application Ser. No. 07/583,059, filed on Sep. 14, 1990, now abandoned.

BACKGROUND OF THE INVENTION

This invention is a silicon-based monolithic integrated circuit which is capable of operating at microwave frequencies from the megahertz to the gigahertz range.

Until about ten years ago, solid state microwave circuits were fabricated exclusively from discrete components that included active semiconductor devices such as transistors and diodes. Even today, the field is shared between this older approach, which to a large extent prevails as the low cost alternative, and the newer monolithic integrated circuit devices. Whereas discrete components are often made using silicon bipolar technologies, monolithic microwave integrated circuits have so far been made primarily in gallium arsenide (GaAs). Monolithic microwave integrated circuits offer improved bandwidth over those that are fabricated from discrete components. This is because the integrated circuit implementation allows the placing of matching networks sufficiently close to individual transistors to avoid electrical losses and to eliminate deleterious parasitic capacitances due, for example, to wire bonds. There is a concomitant reliability advantage that becomes extremely beneficial in applications requiring large numbers of elements or devices, typical of airborne phased array radar implementations, for example. In this and similar applications, each module of the array system may typically require up to three chips incorporating power amplifiers, low-noise amplifiers, and phase shifters. The benefits of integration for microwave applications until now have been available exclusively from gallium arsenide devices.

One reason that GaAs has been chosen for basic electronic functions is that this material has the high value of electron mobility that uniquely enhances device performance particularly at higher frequencies. While discrete silicon bipolar transistors can be and are used at microwave frequencies, integrated silicon implementations which have lower mobility are generally inferior at the higher microwave frequencies. Electron mobility is not the only physical parameter that is in favor of GaAs. The highly insulating quality of the GaAs material also favors high frequency performance relative to silicon. Ordinarily, silicon starting material is several orders of magnitude more electrically conducting than GaAs and this property ultimately limits the maximum available gain that can be delivered at high frequencies by devices fabricated in silicon. It is now believed that it is as much the insulating quality of the GaAs substrate that preferentially enhances the latter's performance relative to silicon in the lower gigahertz ranges as it is the mobility advantage. This insulating quality inhibits parasitic current paths between transistor electrodes on the same chip that would otherwise adversely affect its performance as a microwave integrated circuit.

Historically, and in spite of the fundamental electronic advantages of GaAs as described above, the utilization of this material on a large scale has been slow due to problems in manufacturing. These problems have included the unavailability of consistently high quality GaAs substrate material, processing methods not oriented toward the high quality substrate material, processing methods not oriented toward the high wafer start rates that in silicon have tended to support the evolution of a competitive manufacturing technology, and the basic problems associated with a compound semiconductor as opposed to an elemental one. These are generally reflected in the difficulty of process control and yield maintenance which adversely affect the unit cost. Added to this is the physical as well as the chemical fragility of the material which further complicates manufacturing even from the boule-growth stage. Gallium arsenide wafers are notorious for this brittleness which typically results in only half the started wafers surviving to the RF test point. Whereas the silicon industry is presently gearing up to process 200 mm wafers, GaAs wafers are generally available only up to 75 mm diameter, and at a significantly higher cost than silicon. Since GaAs production today is a small-fraction of the market for silicon-based devices, it is the latter that drives the important wafer processing equipment infrastructure. Thus the cost penalty associated with the superior electronic performance of GaAs is a severe one.

A subset of silicon CMOS technology is so-called SOI (Silicon-On-Insulator). During the last decade, SOI implementations have become highly favored for making radiation-hard signal processing integrated circuits. A subset of SOI is SOS (Silicon-On-Sapphire). This technology addresses radiation hardening requirements by improving the electrical isolation of the components on the substrate. In particular, distributions of excess electrons created by bombarding radiation are effectively confined and prevented from causing electrical upsets or "soft" errors. The same electrical isolation technique also offers a higher frequency advantage. However, the problem with SOS material is that there is an electronically imperfect interface between the insulating sapphire material on which the active silicon is deposited and the active silicon itself. This results in a back channel leakage effect. Whereas the imperfections giving rise to this effect do not impede radiation hardness per se, they tend to be deleterious with respect to normal device performance and to impact adversely the yield of circuits that can perform to full operating specifications. Back channel leakage would be particularly disadvantageous at microwave frequencies because it severely limits the maximum usable gain. Added to these limitations is the minimum thickness of device grade silicon that can be isolated above the non-conducting sapphire substrate. Now, however, there are alternatives to silicon on sapphire.

In the last several years, a new SOI radiation hard silicon materials technology has emerged. This is called Separation by the IMplantation of OXygen (SIMOX). To make a SIMOX wafer, one implants a large dose of oxygen into the subsurface region of the wafer. Annealing then converts this oxygen-rich region to a subsurface insulating glass film. The silicon surface region through which the implantation is made simultaneously reverts to active, device-quality silicon in which circuitry can be synthesized in much the same way as it is in SOS. The advantage of this technique over SOS is that the thickness of the active silicon layer can be made substantially less than it is in SOS, thus further confining the effects of ionizing radiation. Furthermore, the back channel leakage effect is also minimized. However, while the active devices and their various electrodes are indeed decoupled from the substrate in a direct current sense, they remain capacitively coupled to the conducting substrate and therefore to each other at microwave frequencies because of the conducting properties of the silicon starting material. In other words, in spite of their subsurface insulating film, even SIMOX-based devices are not suited to deliver microwave performance because the unimplanted silicon below the implanted insulating layer is conducting at microwave frequencies.

SUMMARY OF THE INVENTION

In light of the performance, fabrication and cost limitations of the existing technologies, it is the object of this invention to provide a technique for the fabrication of monolithic integrated circuits in silicon technology which are capable of operation in the microwave frequency range. It is the further object of this invention to provide a cost effective alternative to gallium arsenide technology for monolithic microwave integrated circuits.

Therefore, this invention discloses an integrated circuit which utilizes a silicon wafer having resistivity of greater than 1000 ohm-cm, an insulating layer within the silicon wafer wherein the insulating layer electrically separates a layer of active silicon from a bulk layer of the wafer, circuitry formed in the layer of active silicon and electrically separated from the bulk layer of the wafer by the insulating layer, wherein the circuitry is operable at microwave frequencies.

Complementary technologies which enhance the high frequency performance of MICROX circuitry include: a bottom surface rectifying contact, circuit features replicated using lithography, low loss microstrip and airbridge interconnections, nitride coating on the wafer bottom during CMOS processing, salicide processing, and nitride side wall spacing.

DESCRIPTION OF THE PREFERRED EMBODIMENTS

This invention discloses a fabrication technique which is a unique combination of silicon material growth and wafer processing technologies. This fabrication technique is called MICROX, an unregistered trademark of the Westinghouse Electric Corporation. This technique yields cost competitive silicon based monolithic integrated circuits which are operable at frequencies from the megahertz to the gigahertz range. As a silicon-based implementation, MICROX integrated circuits take advantage of the extensive technology infrastructure that now supports modern silicon device manufacture. Particularly for those applications requiring dependable sources of large numbers of devices, such as commercial communication systems or expendable decoy and missile systems, the silicon-based MICROX implementation may for the first time make readily available large quantities of custom integrated circuits for specific microwave applications.

Figure 1:
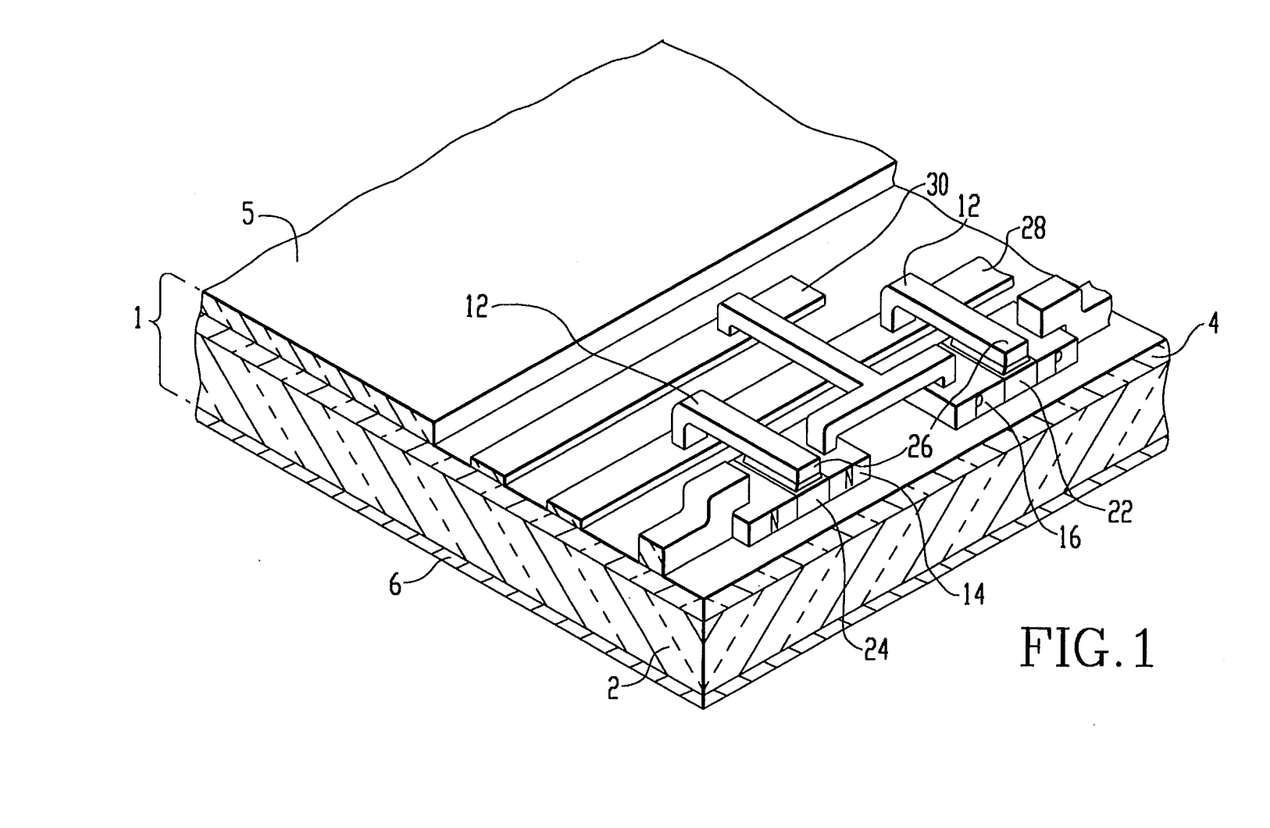
FIG. 1 is an isometric view of part of a typical circuit fabricated in accordance with this invention.

The features of this invention are illustrated in FIG. 1, which shows an isometric view of a portion of an integrated circuit implemented in MICROX technology.

Ordinarily, for silicon based integrated circuits the silicon substrate material 2 is specified to have resistivity ranging from about 2 to 10 ohm-cm. Such material is grown by the Czochralski technique. This low resistivity material is generally favored because it is mechanically, thermally and electronically robust and is readily available from multiple raw material suppliers. On the other hand, low oxygen content, high resistivity silicon, typically prepared by the float-zone technique, has historically been preferred for large bipolar power devices, charge-coupled devices, and solar cells where relatively long minority charge carrier lifetimes are particularly desirable. Float zone material can be grown with much higher resistivity, up to tens of thousands of ohm-cm. In MICROX technology, the substrate material 2 is generally selected to have a resistivity of at least 1000 ohm-cm.

Figure 2:
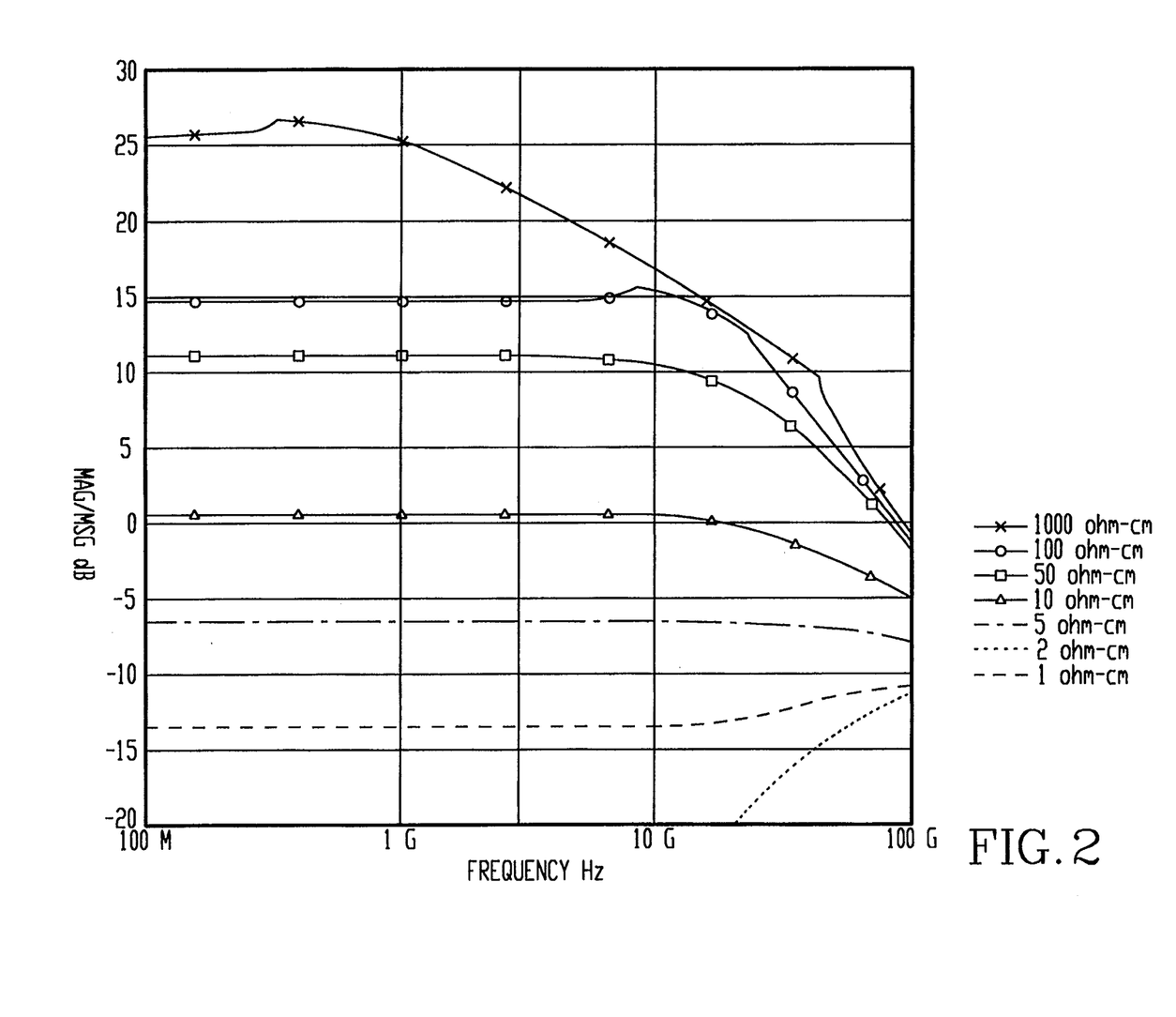
FIG. 2 presents the relationship of Maximum Available Gain/Maximum Stable Gain versus substrate resistivity.

FIG. 2 shows the Maximum Available Gain/Maximum Stable Gain (MAG/MSG) of a 1 cm wide MOSFET with a gate oxide thickness of 50 Å for various substrate resistivities. As resistivity increases, MAG/MSG approaches the values for infinite resistivity. Much of the device performance is lost for substrate resistivity less than 1000 ohm-cm. However, if the resistivity is maintained above 100-ohm cm, the transistor performance is much closer to the theoretical limits. Indeed, for a substrate resistivity greater than 100 ohm-cm this 50 Å device predicts a gain of approximately 15 dB at frequencies exceeding 10 GHz. If substrate resistivity is maintained above 1000 ohm-cm, transistor performance approaches theoretical limits and become adequate for the construction of monolithic microwave integrated circuits.

Prior art experience teaches that high temperatures processing techniques result in the reduction of the resistivity of a silicon substrate. This reduction in resistivity is attributed to the introduction of impurities into the silicon as a result of the high temperatures, and to the migration of existing impurities with the silicon matrix. Any process which involves a temperature over approximately 900 degrees C. with any significant amount of exposure time will degrade the silicon substrate resistivity. The SIMOX process typically includes a six hour annealing step at a temperature of 1350 degrees C. This temperature approaches the melting point of silicon. It is known in the art that such high temperatures will result in the contamination of the silicon by external impurities. It was not obvious to one skilled in the art at the time of this invention that it would be possible to maintain very high resistivity (i.e. very pure silicon) when processing the wafer at temperatures well in excess of 900 degrees C. Therefore, the prior art experience taught away from the use of the SIMOX process for any application when it is desirable to maintain a high resistivity substrate. Westinghouse has found, however, that by starting with a high resistivity substrate, the final resistivity of the bulk silicon after SIMOX processing can still be maintained acceptably high. The layer of oxygen atoms is implanted into essentially the entire wafer, thereby acting as a barrier to the migration of impurities into the layer of bulk substrate material below the insulating layer. By starting with ultra pure, high resistivity material, final substrate resistivities in excess of 1000 ohm-cm or more can be obtained. Therefore, the benefits of the SIMOX process can unexpectantly be utilized for high frequency circuit applications.

An insulating layer, 4 such as produced by the SIMOX process, is utilized as part of the MICROX technology to electronically separate a generally planar upper film of active silicon 5 from the extended bulk silicon layer 2 below, in wafer 1. The separation of the active 5 and bulk 2 regions by the insulating layer 4 is shown in FIG. 1. This electrical separation limits the extent of the critical volumes of silicon from which can be collected the ambipolar charge distributions that disrupt circuit operation. In addition, this layer of isolation 4 also serves to prevent electrical interaction between complementary n-channel 14 and p-channel 16 transistor junctions formed from mesas of the active layer of silicon 5. By forming the active circuit devices in a mesa configuration out of the active silicon layer 5, not only are the active devices 22,24 isolated from each other, but they are also electrically separated from the bulk layer of wafer material 2 by the insulating layer 4.

A ground plane 6 is formed at the bottom of the substrate wafer 2. The ground plane can be a single layer of gold or other conductive material for ohmic contact, or it can be a doped layer plus a layer of a conductive material for a rectifying contact. An ohmic ground plane 6 acts as the circuit ground and as a ground plane for any microstrip circuitry on the wafer. A rectifying ground plane 6 acts in combination with the insulating properties of the high resistivity substrate wafer material 2, to ensure the total depletion of the substrate material.

A typical silicon wafer is approximately 20 mils thick. The insulating layer 4 is preferably about 2000 Å thick, and is located no more than about 2000 Å below the top surface of the wafer, thus forming the generally planar upper film of active silicon 5 approximately 2000 Å thick wherein the semiconductor device structures (14, 16, 22, 24) are formed in a mesa configuration. The ground plane 6 is preferably about 5 microns thick.

In gallium arsenide implementations, suppression of parasitic losses of this kind are provided by the insulating quality of the gallium arsenide material. In MICROX technology, the combination of the insulating layer 4, the high resistivity substrate material 2, and the ground plane 6 provides not only the effective termination of the bulk substrate depletion, but also the avoidance of resistive RF losses resulting from capacitive coupling of the MOS transistor source and drain electrodes to the parent substrate.

A complementary manufacturing technology for MICROX implementation is micron or submicron lithography (not shown). Generally speaking, the smaller the minimum geometry with which features can be replicated on the semiconductor surface, the higher will be the frequency at which the device will operate, all other things being equal. In the preferred embodiment, FET gates 26 measure approximately 0.25 micron or less in length. Any of the various lithographic tools can be used for forming the maskwork for high frequency semiconductor device fabrication, such as X-ray lithography, optical lithography or electron beam direct write technology.

An additional distinguishing feature of this invention is its compatibility with the use of microstrip 28, 30 and air gap circuit crossover connections 12. The process for fabricating microstrip is known in the art, and consists of selective layering and removal of photoresist material to define areas for the deposit of gold or other conductive material. Typically a plating base of about 500 Å tungsten and 500 Å gold is evaporated or sputtered onto the wafer surface, followed by a layer of photoresist material which is selectively developed and removed in the areas where the microstrip is desired, followed by the deposit by electroplating of approximately 3-5 microns of the conductive material, followed by removal of the photoresist, and an acid etch to remove the uncoated areas of plating base material. Microstrip has been fabricated on high resistivity silicon where the losses were less than 0.1 dB/cm. Airbridge connections are utilized to interconnect two points on the circuit where direct in-plane connection is not possible due to the circuit geometry. The airbridge connection consists of a connector located above, and separated from, the top layer of the wafer, with ends which extend downward and are connected to predetermined points on the circuit. Airbridge connections, also known in the art, are fabricated through selective layering with photoresist material to define areas for the deposit of gold or other conductive material. Typically, the area of air separation under the airbridge is defined with a first layer of photoresist material, followed by the depositing of a plating base as described above. A second layer of photoresist material is then used to define the areas to be connected by the airbridge connection, and conductive material is deposited as described above. The second photoresist material is then removed, followed by an acid etch to remove the uncoated areas of plating base material, followed by the removal of the first layer of photoresist material, leaving the conductive material in the shape of an airbridge 12. These technologies are further aids to the minimization of parasitic capacitive RF losses, thus improving the performance of the device at microwave frequencies.

Figure 5:
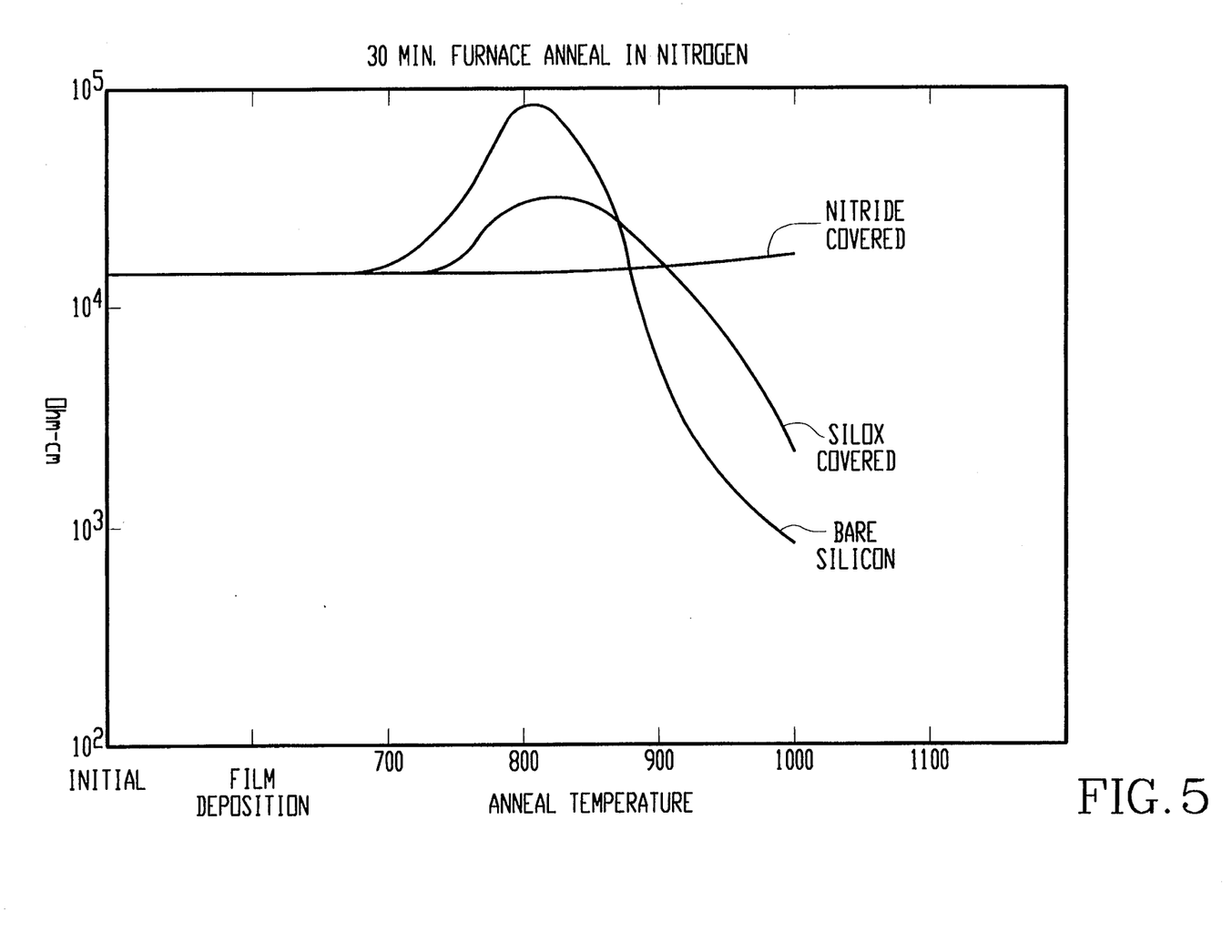
FIG. 5 represents the relationship of silicon resistivity verses anneal temperature for a slow anneal.
Figure 6:
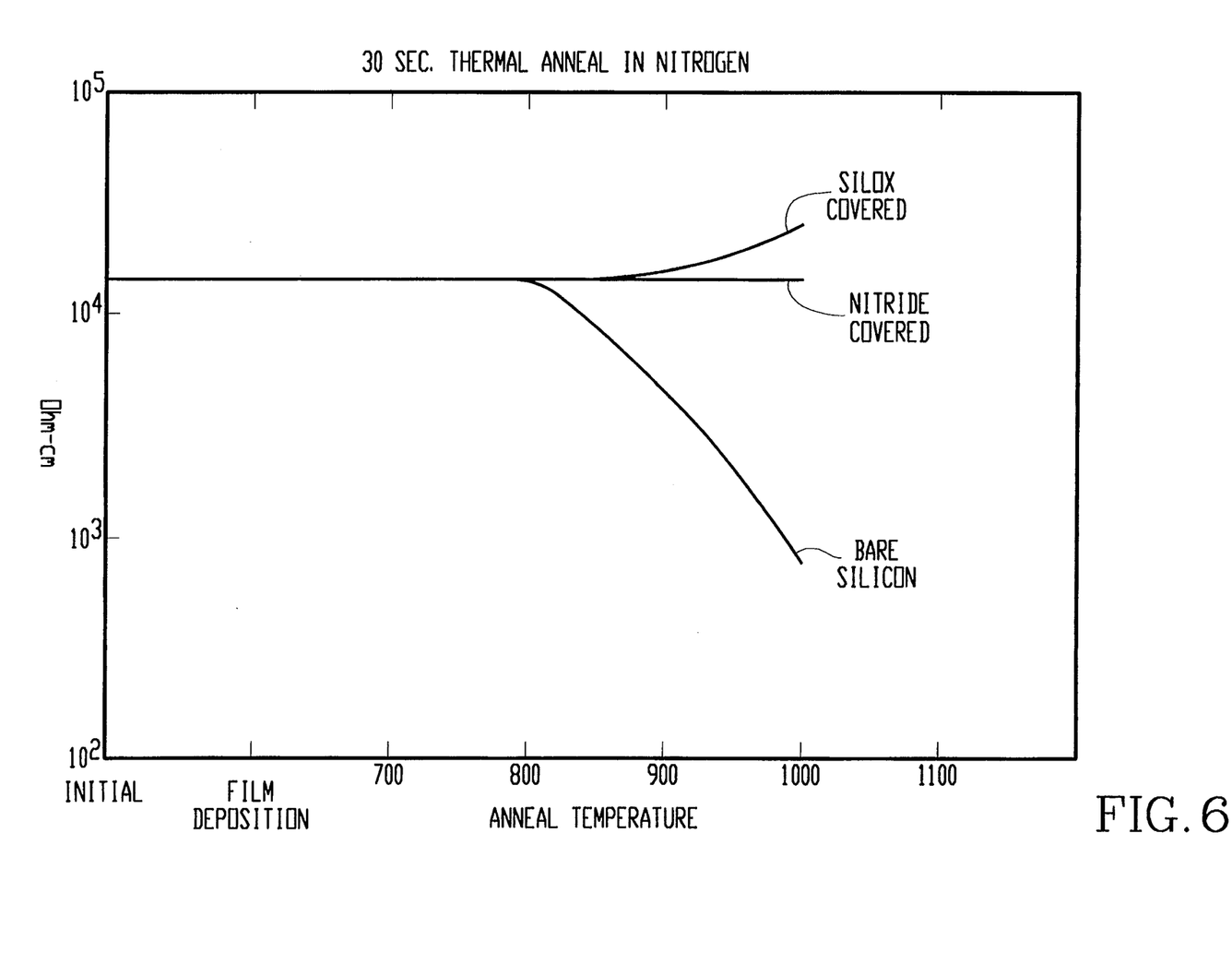
FIG. 6 represents the relationship of silicon resistivity verses anneal temperature for a rapid anneal.

Special wafer processing techniques can also be applied to improve the performance of MICROX circuits. The first is the preservation of a shielding layer on the bottom side of the wafer during the entire CMOS process. The shielding layer may be nitride or other high purity material which will maintain its integrity throughout the CMOS processing steps. In CMOS processing a nitride layer is formed on the wafer as one step in the mesa forming process. The nitride is then typically removed from the entire wafer by a wet etch. The inventors have demonstrated that the presence of such a shielding layer tends to preserve the resistivity of a silicon wafer through the annealing process, as illustrated in FIGS. 5 and 6. These figures plot the resistivity of very high resistance silicon verses anneal temperature for bare silicon, for silox covered silicon, and for nitride covered silicon. FIG. 5 is for a 30 minute anneal, and FIG. 6 is for a 30 second anneal. In a MICROX process, the nitride can be preserved on the bottom side of the wafer by depositing a silox coating onto the bottom surface of the wafer prior to the wet etch step. The nitride and silox coatings can remain on the wafer through the remaining CMOS processing steps, eventually being removed or covered by the ground plane layer shown as 6 on FIG. 1. The shielding layer and the implanted oxygen layer 4 serve to isolate the layer of bulk silicon 2 from the ambient environment during wafer processing.

Another wafer processing technique which can be applied is the use of a salicide process. The salicide process involves the reaction of exposed silicon surfaces with titanium, or a similarly reactive metal, to form a surface coating of titanium silicide. The silicide coating serves to lower the resistivity of the device silicon, thus improving its performance.

Finally, nitride side wall spacing can also be used to space dopants away from the edge of the gate on field effect transistors. In this process, a nitride coating is formed on the sides of a polysilicon gate. This coating serves to shield the later deposited source and drain dopants from the edge of the channel area. This spacing prevents the later migration of the dopants to the channel area under the gate, thus ensuring proper device performance.

The specific technical feasibility of the MICROX implementation is based on recent results that show that MOS field effect transistors fabricated with 0.25 micron gate lengths on bulk silicon with gate oxide thicknesses of 36 Angstrom exhibit transconductances of 680 mS/mm. This figure is close to the values that can be achieved with GaAs high electron mobility transistors. Furthermore, a cut-off frequency of 10 GHz has been demonstrated for a MICROX transistor having 0.5 micron gate length and 100 Angstrom gate oxide thickness.

Figure 3:
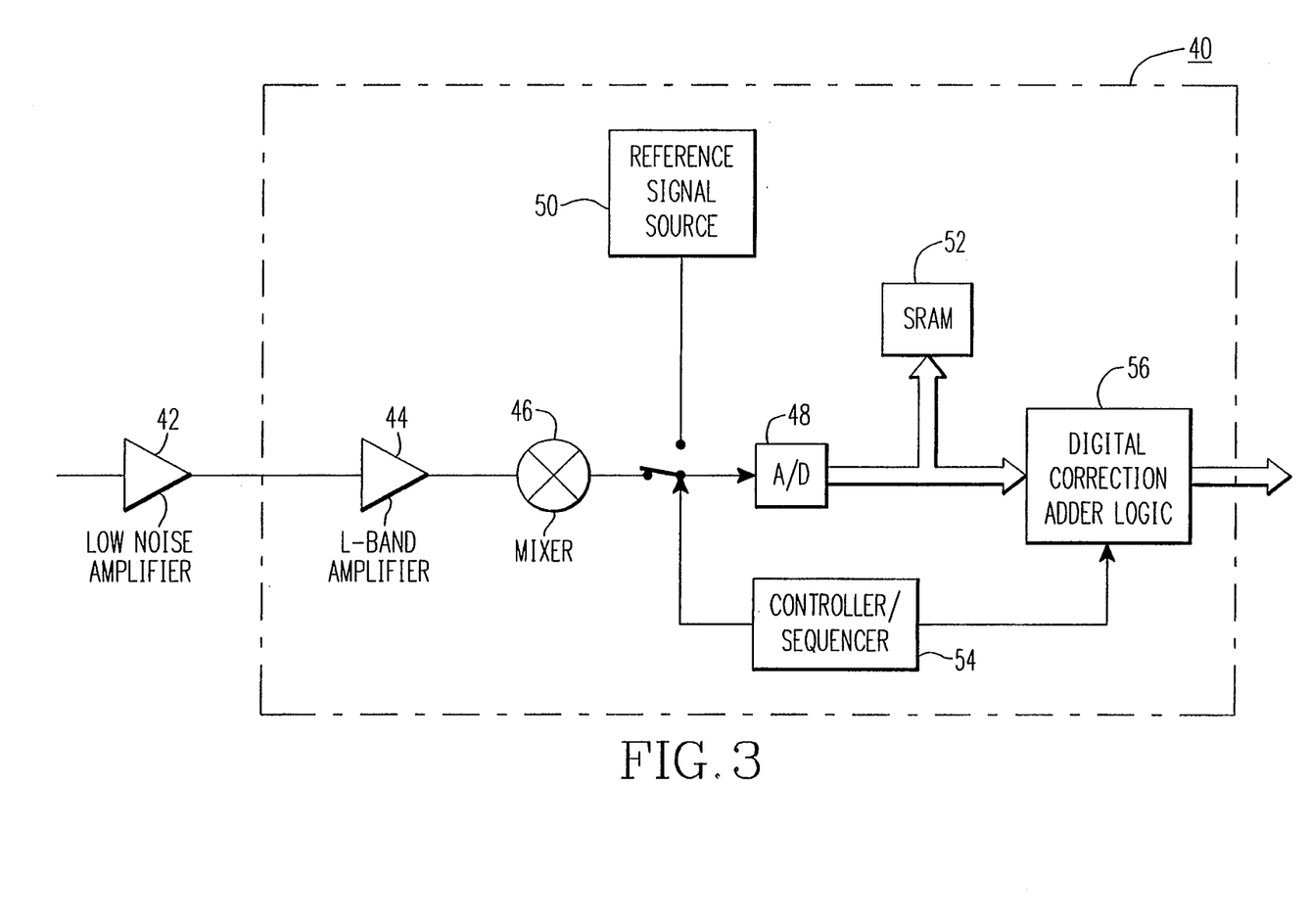
FIG. 3 is a block diagram of a preferred embodiment of the invention, a digital beam forming receiver chip.

A very real need that could be fulfilled by this invention is shown in FIG. 3. This particular embodiment is for a digital beam forming receiver chip 40. In the design of phased array antenna systems that utilize main beam nulling by digital means, it is essential that each of the many receivers be highly matched. In fact it is desirable to match each receiver to a 60 dB level. This is an exceptionally difficult task when the receivers are implemented in a hybrid configuration. In a phased array radar system, hundreds to thousands of highly matched receivers are needed and the aggregate cost of these hybrid receivers tends to be prohibitive. The MICROX implementation is ideally suited for the digital beam forming application. It is envisioned that each of the transmit/receive (T/R) modules in a phased array would be equipped with two MICROX digital receiver chips 40. A separate GaAs low noise amplifier 42 would establish the noise figure of each individual receiver and would electronically precede the MICROX digital receiver chip as illustrated in FIG. 3. The receiver itself would consist of an L-Band amplifier 44 that drives a high dynamic range mixer 46. The output of the mixer would feed the input of an analog/digital (A/D) converter 48 that is designed to sample directly at the IF frequency, thereby eliminating the need for separate in-phase and quadrature receiver channels.

The A/D resolution of the converter could also be improved through the use of on-chip calibration. A reference signal source 50 would be switched into the input of the A/D converter. Correction factors would then be generated and stored in on-chip Static Random Access Memory (SRAM) 52, a capability that is uniquely offered by the proposed MICROX implementation. To coordinate all these activities, a digital controller/seqencer 54 and digital correction adder logic 56 would also be included on the MICROX digital receiver chip.

Figure 4:
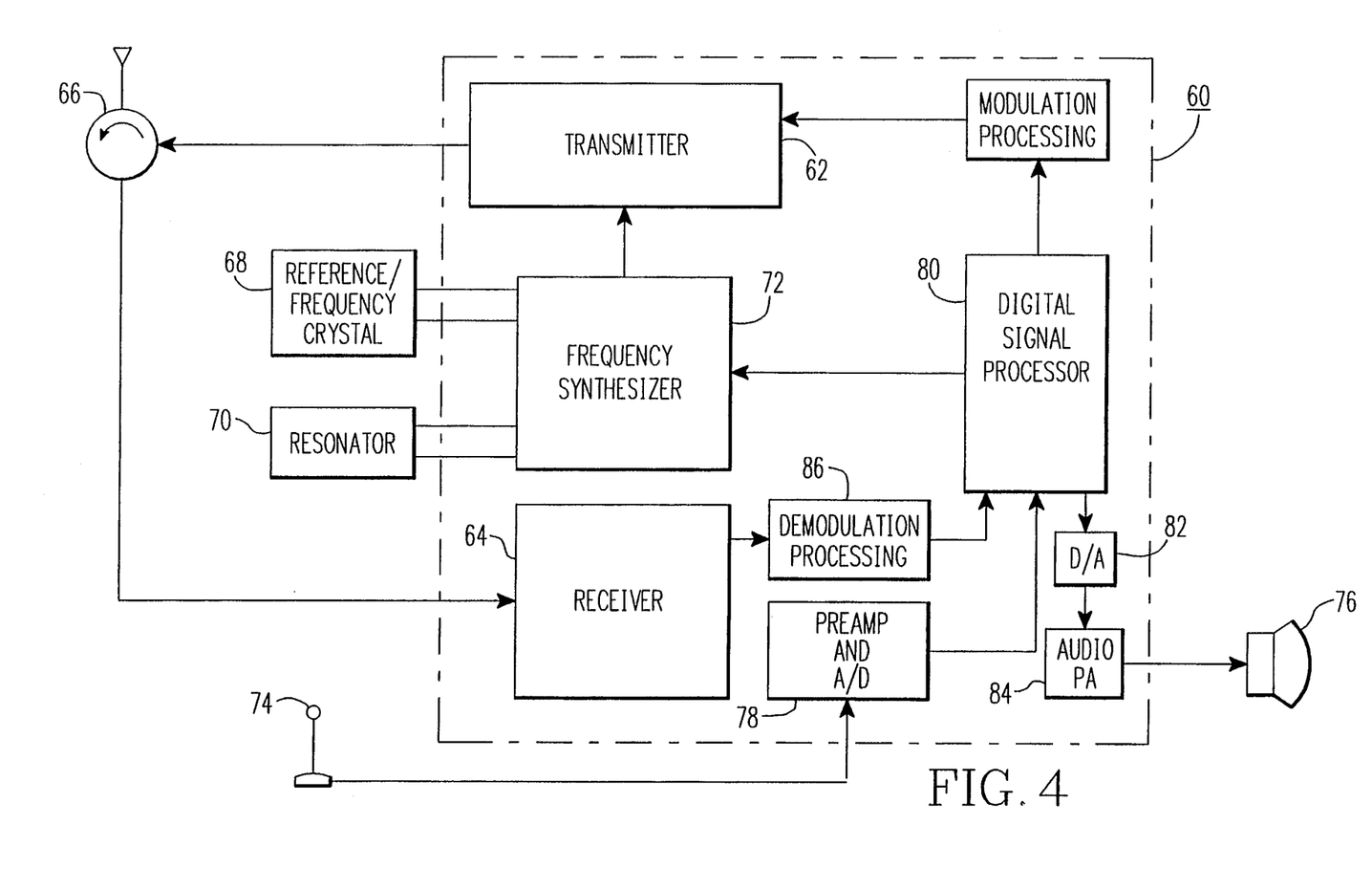
FIG. 4 is a block diagram of another preferred embodiment of the invention, a cellular telephone application.

Another embodiment of this invention is a cellular telephone application, illustrated in FIG. 4. Monolithic integrated circuit 60 is fabricated in MICROX technology, and it includes functions which require as many as six separate chips in existing devices. All functions required for cellular telephone operation are included on integrated circuit 60 with the exception of the antenna circulator 66, the reference frequency crystal 68, a resonator 70, and the audio input 74 and output 76 devices. The transmitter circuitry 62 and receiver circuitry 64 are connected to the antenna through the off-chip circulator 66. A frequency synthesizer 72 services both the transmitter 62 and receiver 64 circuitry. The voice microphone 74 provides input to a preamplifier and A/D converter 78. This input information is processed by a digital signal processor 80, which in turn provides output to an audio power amplifier 84 through a D/A converter 82. The MICROX integrated circuit 60 also contains demodulation processing 86 and modulation processing 88 circuitry. This embodiment of MICROX technology utilizes miniature thin film microwave frequency acoustic filter devices, such as disclosed by Dawson, et al, in co-pending application Ser. No. 499,865, filed on Mar. 26, 1990 and assigned to the same assignee as this application. This monolithic integrated circuit can be designed for operation at either the current 800 MHz application or the planned 1-2 GHz range, due to the high frequency capability of the MICROX circuitry.

Both of the above-described embodiments may incorporate circuit redundancy and on-wafer mechanical switches to improve the yield and flexibility of the MICROX wafers. These features involve the fabrication of a multiplicity of redundant circuits on the wafer, and selectively interconnecting certain of these circuits during the fabrication and test of the devices. This interconnection is accomplished with on-wafer mechanical switches which can be closed at room temperatures using standard pressure sensitive techniques. Additional details regarding the design and fabrication of these switches can be found in U.S. Pat. No. 4,823,136 to Nathanson, et al., assigned to Westinghouse Electric Corporation, and herein incorporated by reference.

MICROX technology offers the advantage of CMOS processing to integrate a large number of functions without performance compromises because it provides superior isolation between active devices, reduced parasitics, isolation between functional circuits, and the highest density of devices. Other embodiments of MICROX architecture include integration of fast logic and memory on the same chip that performs the analog function and, very importantly, the provision of complementary p- and n-channel devices for high efficiency power amplification. This complementary circuitry is generally not available in GaAs technology but is an established feature of modern silicon technology. MICROX silicon-based semiconductor wafer fabrication technology for microwave devices offers the advantage of integration of analog and digital functions at microwave frequencies unattainable by present silicon monolithic circuit technology. MICROX devices extend the working frequency of silicon analog, logic, and switching devices well into the microwave region. Thus MICROX technology offers the advantages of potentially lower cost than alternative approaches, greater versatility of functions, and higher reliability.

In light of the foregoing specification and drawings, we claim as our invention the following:

1. An integrated circuit comprising:
   a generally planar silicon wafer having resistivity greater than 1000 ohm-cm;
   circuitry formed in a layer of active silicon, said circuitry being electrically separated from a bulk layer of said wafer by a generally planar insulating layer; and
   wherein said circuitry is operable at microwave frequencies.

2. The device of claim 1, further comprising a shielding layer on a bottom surface of said silicon wafer.

3. The device of claim 1, further comprising a conducting layer on a bottom surface of said silicon wafer.

4. The device of claim 3, further comprising said conducting layer comprising a metallic conductor, wherein said metallic conductor and said silicon wafer and a signal carrying conductor on said top surface of said wafer comprise a microstrip.

5. The device of claim 1, wherein said circuitry further comprises both analog and digital semiconductor devices.

6. The device of claim 1, wherein said circuitry further comprises both analog amplifier circuitry and digital signal processing circuitry.

7. The device of claim 5, further comprising said circuitry forming a cellular telephone circuit.

8. The device of claim 5, further comprising said circuitry forming a digital beam forming receiver circuit.

9. The device of claim 1, further comprising said circuitry being formed in a mesa configuration.

10. An integrated circuit comprising:
    a generally planar layer of bulk silicon having resistivity greater than 1000 ohm-cm;
    a generally planar insulating layer disposed on an entire surface of said layer of bulk silicon;
    a layer of active silicon disposed on said insulating layer and electrically isolated from said layer of bulk silicon by said insulating layer, said layer of active silicon having voids therein which define mesas of active silicon;
    circuitry formed in said mesas of active silicon, wherein said circuitry is operable at microwave frequencies.

* * * * *